United States Patent
Takagi et al.

(10) Patent No.: US 9,407,065 B2
(45) Date of Patent: Aug. 2, 2016

(54) SEMICONDUCTOR LASER

(75) Inventors: Shigeyuki Takagi, Kanagawa-ken (JP);
Hidehiko Yabuhara, Kanagawa-ken (JP); Akira Maekawa, Kanagawa-ken (JP); Takayoshi Fujii, Kanagawa-ken (JP); Yasutomo Shiomi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 71 days.

(21) Appl. No.: 13/565,008

(22) Filed: Aug. 2, 2012

(65) Prior Publication Data
US 2013/0195136 A1  Aug. 1, 2013

(30) Foreign Application Priority Data
Aug. 3, 2011  (JP) ................ 2011-170145

(51) Int. Cl.
*H01S 5/34* (2006.01)
*H01S 5/20* (2006.01)
*H01S 5/22* (2006.01)
(Continued)

(52) U.S. Cl.
CPC .............. *H01S 5/2054* (2013.01); *B82Y 20/00* (2013.01); *H01S 5/2022* (2013.01); *H01S 5/2219* (2013.01); *H01S 5/3402* (2013.01); *H01S 5/12* (2013.01); *H01S 5/2031* (2013.01);
(Continued)

(58) Field of Classification Search
CPC ... H01S 5/2054; H01S 5/2205; H01S 5/2218; H01S 5/3402; H01S 2301/166; H01S 2301/176; H01S 5/3221; H01S 5/2219
USPC ..................................................... 372/45.01
See application file for complete search history.

(56) References Cited

U.S. PATENT DOCUMENTS 4,607,369 A * 8/1986 Niina et al. ................ 372/46.01
5,143,863 A * 9/1992 Ohnaka et al. .................. 438/39
(Continued)

FOREIGN PATENT DOCUMENTS

CN 1332502 A 1/2002
JP 58-148777 A 9/1983
(Continued)

OTHER PUBLICATIONS

Office Action issued Dec. 3, 2013 in Japanese Patent Application No. 2011-170145 (with English language translation).
(Continued)

*Primary Examiner* — Yuanda Zhang
*Assistant Examiner* — Michael Carter
(74) *Attorney, Agent, or Firm* — Oblon, McClelland, Maier & Neustadt, L.L.P (57) ABSTRACT

A semiconductor laser includes: a stacked body having an active layer including a quantum well layer, the active layer having a cascade structure including a first region capable of emitting infrared laser light with a wavelength of not less than 12 μm and not more than 18 μm by an intersubband optical transition of the quantum well layer and a second region capable of relaxing energy of a carrier alternately stacked, the stacked body having a ridge waveguide and being capable of emitting the infrared laser light; and a dielectric layer provided so as to sandwich both sides of at least part of side surfaces of the stacked body, a wavelength at which a transmittance of the dielectric layer decreases to 50% being 16 μm or more, the dielectric layer having a refractive index lower than refractive indices of all layers constituting the active layer.

17 Claims, 8 Drawing Sheets

(51) Int. Cl.
*B82Y 20/00* (2011.01)
*H01S 5/12* (2006.01)
*H01S 5/32* (2006.01)

(52) U.S. Cl.
CPC ........ *H01S 5/3211* (2013.01); *H01S 2301/166* (2013.01); *H01S 2301/176* (2013.01)

(56) References Cited

U.S. PATENT DOCUMENTS

| | | | | |
|---|---|---|---|---|
| 5,404,027 | A * | 4/1995 | Haase | B82Y 20/00 257/13 |
| 6,463,088 | B1 * | 10/2002 | Baillargeon et al. | 372/46.01 |
| 7,457,338 | B2 * | 11/2008 | Mawst et al. | 372/43.01 |
| 2010/0002739 | A1 * | 1/2010 | Hu et al. | 372/45.01 |
| 2010/0111127 | A1 * | 5/2010 | Edamura et al. | 372/45.012 |

FOREIGN PATENT DOCUMENTS

| | | | |
|---|---|---|---|
| JP | 63-307793 | A | 12/1988 |
| JP | 1-302203 | A | 12/1989 |
| JP | 4-351943 | A | 12/1992 |
| JP | 5-332920 | A | 12/1993 |
| JP | 06-347607 | A | 12/1994 |
| JP | 10-160570 | A | 6/1998 |
| JP | 2000-171728 | A | 6/2000 |
| JP | 2000-353848 | A | 12/2000 |
| JP | 2002-071460 | A | 3/2002 |
| JP | 2002-76516 | A | 3/2002 |
| JP | 2002-540639 | A | 11/2002 |
| JP | 2004-205415 | A | 7/2004 |
| JP | 2004-247492 | A | 9/2004 |
| JP | 2006-093683 | A | 4/2006 |
| JP | 2006-235139 | A | 9/2006 |
| JP | 2008-10733 | A | 1/2008 |
| JP | 2008-218915 | A | 9/2008 |
| JP | 2010-204246 | A | 9/2010 |

OTHER PUBLICATIONS

Japanese Office Action Issued Jun. 14, 2013 in Patent Application No. 2011-170145 (with English translation).
Combined Chinese Office Action and Search Report issued Dec. 3, 2013, in Chinese Patent Application No. 201210276138.5 with English translations.
Chinese Office Action issued on Aug. 6, 2014 in corresponding Chinese patent application No. 201210276138.5 (with English translation).
Michel Rochat et al., "Long-wavelength ($\lambda \approx 16$ µm), room-temperature, single frequency quantum-cascade lasers based on a bound-to-continuum transition" pp. 4271-4273 (2001).
Office Action issued Jan. 21, 2015 in Chinese Patent Application No. 201210276138.5 (with English translation).
C. Gmachl et al., Noncascaded intersubband injection lasers at $\lambda \approx$ 7.7µm, Applied Physics Letters, vol. 73, No. 26, pp. 3380-3382 (Dec. 1998).
F. Capasso et al., Infrared (4-11 µm) Quantum Cascade Lasers, Solid State Communications, vol. 102, No. 2-3, pp. 231-236 (1997).
J. Faist et al., Quantum Cascade Laser, Science, vol. 264, pp. 553-556 (Apr. 22, 1994).
Japanese Office Action issued on Jun. 30, 2015 in corresponding Japanese Patent Application No. 2014-172522 (w/English translation).
S. Gianordoli et al., Improved Performance of GaAs-AlGaAs Superlattice Quantum Cascade Lasers Beyond $\lambda \approx 13$ µm, IEEE Photonics Technology Letters, USA, IEEE, Sep. 2000, vol. 12, No. 9, p. 1144-p. 1146.
Alessandro Tredicucci et al., Long wavelength superlattice quantum cascade lasers at $\lambda \sim 17$ µm, Applied Physics Letters, USA, American Institute of Physics, Feb. 1999, vol. 74, No. 5, p. 638-p. 640.
Office Action issued on Feb. 3, 2016 in Japanese Patent Application No. 2014-172522 with English translation.

* cited by examiner

SEMICONDUCTOR LASER

CROSS-REFERENCE TO RELATED APPLICATIONS

This application is based upon and claims the benefit of priority from the prior Japanese Patent Application No. 2011-170145, filed on Aug. 3, 2011; the entire contents of which are incorporated herein by reference.

FIELD

Embodiments described herein relate generally to a semiconductor laser.

BACKGROUND

Lasers that emit infrared light have a wide field of application such as environmental measurement. In many kind of lasers, quantum cascade lasers made of semiconductors are small sizes and highly convenient, and enable high-accuracy measurement.

The quantum cascade laser includes, for example, an active layer including quantum well layers in which GaInAs and AlInAs are alternately stacked. Further, the quantum cascade laser has a structure in which both side surfaces of the active layer are placed between, for example, InP cladding layers. In this case, the quantum well layers cascade-connected can emit infrared laser light with a wavelength of 4 to 10 µm by the intersubband optical transition of carriers.

However, in the case of infrared laser light with a wavelength of 10 µm or more, infrared laser light emitted from the active layer is absorbed in the InP cladding layers on both side surfaces of the active layer because of light absorption due to lattice vibrations (phonons) of InP. Consequently, light emitting efficiency is reduced, and it is difficult to obtain high-power laser light.

DETAILED DESCRIPTION

In general, according to one embodiment, a semiconductor laser includes a stacked body and a dielectric layer. The stacked body has an active layer including a quantum well layer. The active layer has a cascade structure including a first region capable of emitting infrared laser light with a wavelength of not less than 12 µm and not more than 18 µm by an intersubband optical transition of the quantum well layer and a second region capable of relaxing energy of a carrier injected from the first region alternately stacked. The stacked body has a ridge waveguide and is capable of emitting the infrared laser light in a direction along which the ridge waveguide extends. A dielectric layer is provided so as to sandwich both sides of at least part of side surfaces of the stacked body in a cross section orthogonal to the ridge waveguide. A wavelength at which a transmittance of light of the dielectric layer decreases to 50% is 16 µm or more. The dielectric layer has a refractive index lower than refractive indices of all layers constituting the active layer.

Various embodiments will be described hereinafter with reference to the accompanying drawings.

Figure 1A:
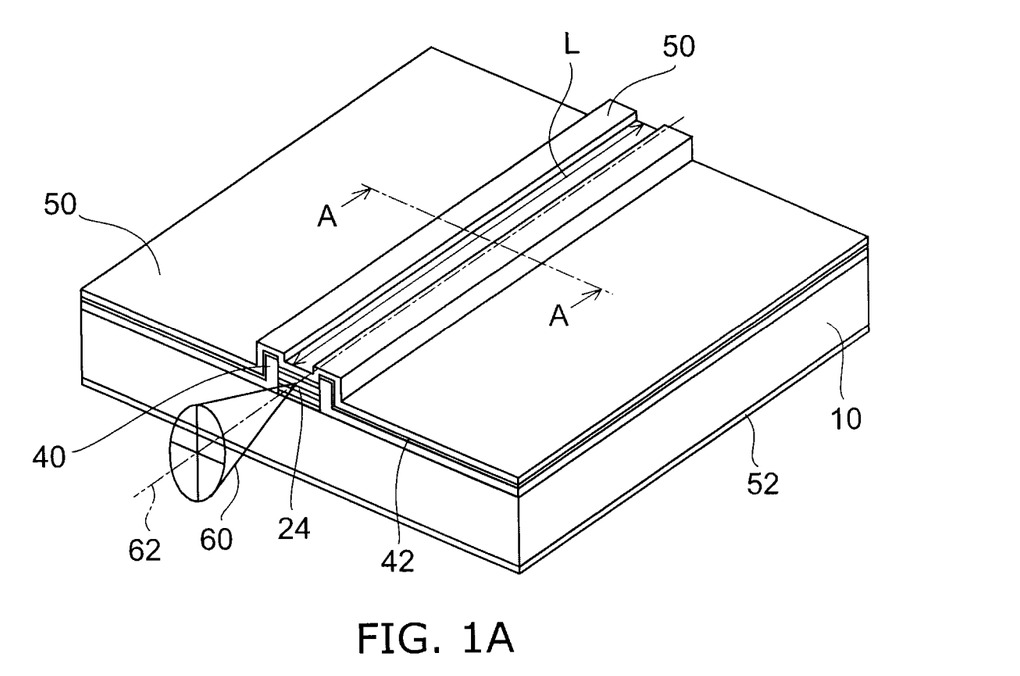
FIG. 1A is a schematic perspective view of a portion cut out of a semiconductor laser according to a first embodiment of the invention.
Figure 1B:
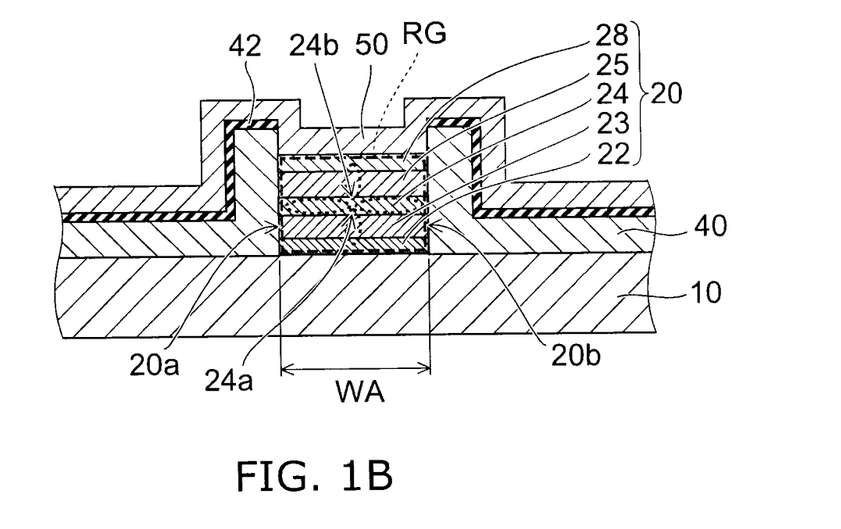
FIG. 1B is a schematic cross-sectional view taken along line A-A.

FIG. 1A is a schematic perspective view of a portion cut out of a semiconductor laser according to a first embodiment of the invention, and FIG. 1B is a schematic cross-sectional view taken along line A-A.

The semiconductor laser includes at least a substrate 10, a stacked body 20 provided on the substrate 10, and a dielectric layer 40. In FIG. 1A, the semiconductor laser further includes a first electrode 50, a second electrode 52, and an insulating film 42.

The stacked body 20 includes a first cladding layer 22, a first guide layer 23, an active layer 24, a second guide layer 25, and a second cladding layer 28. The refractive index of the first cladding layer 22 and the refractive index of the second cladding layer 28 are set lower than all of the refractive indices of the first guide layer 23, the active layer 24, and the second guide layer 25 so that infrared laser light 60 may be appropriately confined in the stacking direction of the active layer 24. The first guide layer 23 and the first cladding layer 22 may be collectively called a cladding layer. Furthermore, the second guide layer 25 and the second cladding layer 28 may be collectively called a cladding layer.

The stacked body 20 has a striped configuration, and may be called a ridge waveguide RG. When the two end surfaces of the ridge waveguide RG are configured to be mirror surfaces, light generated by stimulated emission is emitted from the light emission surface as infrared laser light 60. In this case, the optical axis 62 is defined as a line connecting centers of a cross section of an optical resonator of which the mirror surfaces serve as resonance surfaces. That is, the optical axis 62 agrees with the direction along which the ridge waveguide RG extends.

If the width WA in a direction parallel to a first surface 24a and a second surface 24b of the active layer 24 is excessively wide in a cross section perpendicular to the optical axis 62, a higher-order mode occurs in a horizontal direction, and this makes it difficult to obtain high power. When the width WA of the active layer 24 is set to, for example, 5 to 20 µm or the like, the mode control in the horizontal direction is easy. When the refractive index of the dielectric layer 40 is set lower than the refractive indices of all the layers constituting the active layer 24, the ridge waveguide RG can be formed along the optical axis 62 by the dielectric layers 40 provided so as to sandwich the side surfaces 20a and 20b of the stacked body 20.

Figure 2:
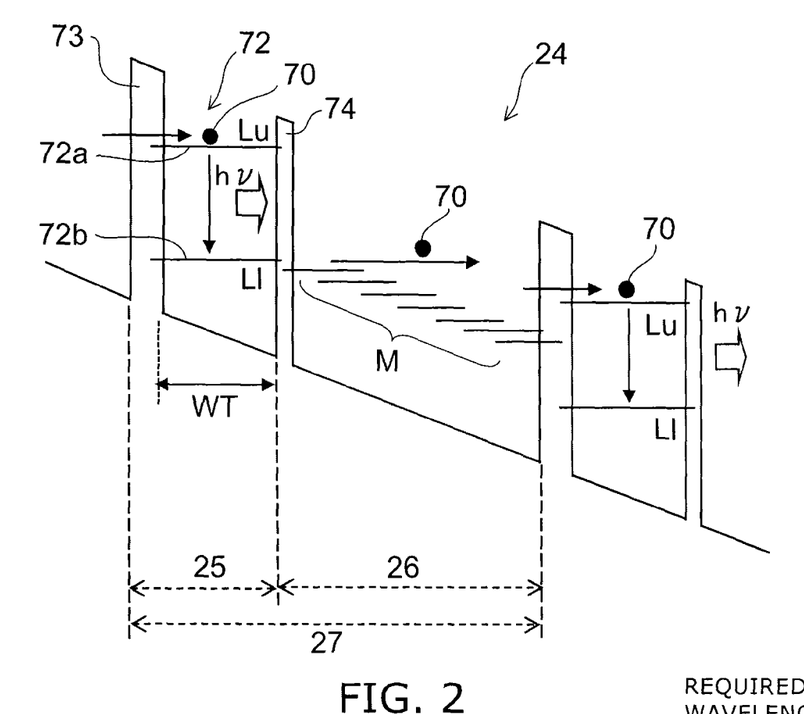
FIG. 2 is a band diagram describing the operation of the semiconductor laser according to the first embodiment.

FIG. 2 is a band diagram describing the operation of the semiconductor laser according to the first embodiment.

The active layer 24 has a cascade structure in which a first region 25 and a second region 26 are alternately stacked. The first region 25 can emit infrared laser light 60 with a wavelength of, for example, not less than 12 μm and not more than 18 μm by the intersubband optical transition of a quantum well layer 72. The second region 26 can relax the energy of a carrier (e.g. an electron) 70 injected from the first region 25.

In the quantum well layer 72, when the thickness WT of the well layer is decreased to, for example, several nanometers or less, the energy level is divided into a subband 72a (a high level Lu), a subband 72b (a low level Ll), etc. An electron 70 injected through an injection barrier layer 73 can be effectively confined in the quantum well layer 72. When the carrier transitions from the high level Lu to the low level Ll, light (hν) corresponding to the energy difference (Lu–Ll) is emitted (optical transition). The quantum well layer 72 may include a plurality of wells where the wave functions overlap, and may have common levels Lu and Ll.

Intersubband transition occurs in either of the conduction band and the valence band. That is, recombination of holes and electrons in p-n junction is not necessary, and light emission is made by the optical transition of only one kind of carrier. In FIG. 2, the stacked body 20 uses the voltage applied between the first electrode 50 and the second electrode 52 to inject the electron 70 into the quantum well layer 72 via the injection barrier layer 73, and causes an intersubband transition.

The second region 26 has a plurality of subbands (also called minibands). The energy difference between subbands is preferably small to form almost a continuous energy band. Consequently, since the energy of the electron is relaxed, infrared laser light with a wavelength of 12 to 18 μm is not generated in the second region 26. The electron of the low level Ll in the first region 25 passes through an extraction barrier layer 74 to be injected into the second region 26 and relaxed, and is injected into the first region 25 of the next stage cascade-connected (the electron 70) to make another optical transition. That is, in the cascade structure, since the electron 70 makes optical transitions individually in unit structures 27, it is easy to extract high-power light output in the entire active layer 24.

In the first embodiment, the quantum well layer 72 may contain GaAs, and the barrier layer may contain $Al_xGa_{1-x}As$ (0<x<1). In this case, when the substrate 10 is made of GaAs, lattice matching between the quantum well layer and the barrier layer is satisfactorily made. The first cladding layer 22 and the second cladding layer 28 may have an n-type impurity concentration of, for example, $6\times10^{18}$ $cm^{-3}$ by Si doping, and may have a thickness of, for example, 1 μm. The first guide layer 23 and the second guide layer 25 may have an n-type impurity concentration of, for example, $4\times10^{16}$ $cm^{-3}$ by Si doping, and may have a thickness of 3.5 μm. The width WA of the active layer 24 may be 14 μm, and the length L of the ridge waveguide RG may be 3 mm or the like.

The active layer 24 in which the Al mole fraction x of the barrier layer is set to 0.32, the thickness WT of the well layer of the quantum well layer 72 made of GaAs is set to, for example, 2 to 6 nm, and unit structures 27 capable of effectively confining an electron in the quantum well layer 72 are cascade-connected in 50 stages has a thickness of, for example, 2 μm or the like. According to experiments, infrared laser light with a wavelength of 16±0.3 μm was able to be obtained when an electric field of 33.5 kV/cm was applied by means of the first electrode 50 and the second electrode 52.

Figure 3:
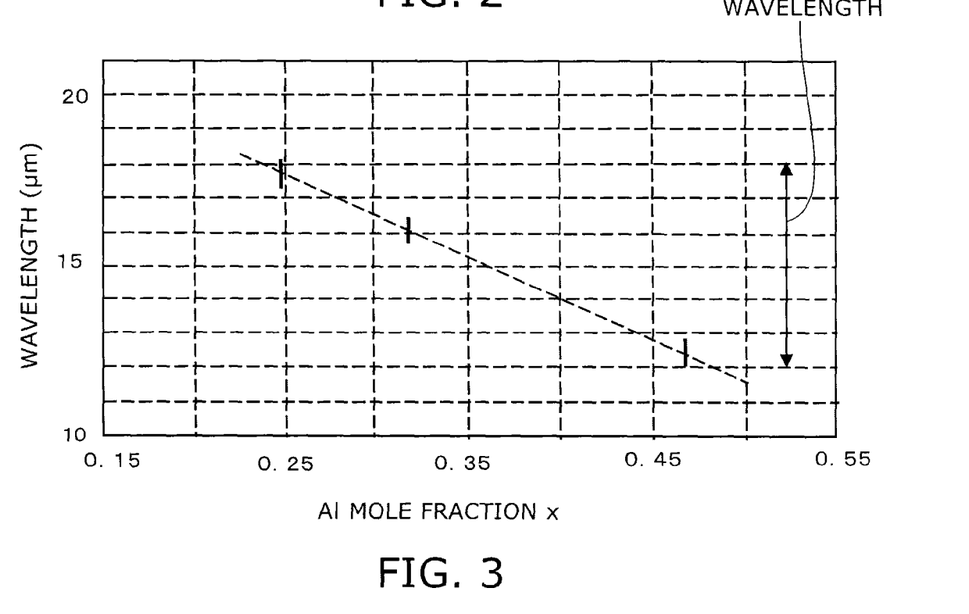
FIG. 3 is a graph showing the dependence of the wavelength of infrared laser light on the Al mole fraction x of $Al_xGa_{1-x}As$.

FIG. 3 is a graph showing the dependence of the wavelength of infrared laser light on the Al mole fraction x of $Al_xGa_{1-x}As$. According to experiments, it has been found that, when the Al mole fraction x is 0.25, the wavelength is 17.7±0.3 μm, and when the Al mole fraction is 0.47, the wavelength is 12.3±0.3 μm. That is, as indicated by the broken line in FIG. 3, infrared laser light in a required wavelength range with a wavelength of 12 to 18 μm was able to be obtained by changing the Al mole fraction x.

The substrate 10 may be made of InP (refractive index: 2.50), and the first and second cladding layers 22 and 28 may be made of InP (refractive index: 3.089). That is, when the active layer 24 contains InAlAs and InGaAs and the thickness WT of the well layer of the quantum well layer 72 is controlled, infrared laser light with a wavelength in a range of not less than 12 μm and not more than 18 μm can be obtained.

In environmental measurement etc., infrared laser light of 12 to 18 μm is often required. Here, for example, infrared laser light of 12 μm or more can be obtained also by using a Raman laser to wavelength-convert infrared laser light with a wavelength of 10 μm emitted from a carbon dioxide gas laser or the like. However, the laser may have a complicated configuration and a large size. In contrast, the quantum cascade laser is a semiconductor laser and this is easy to downsize.

Figure 4:
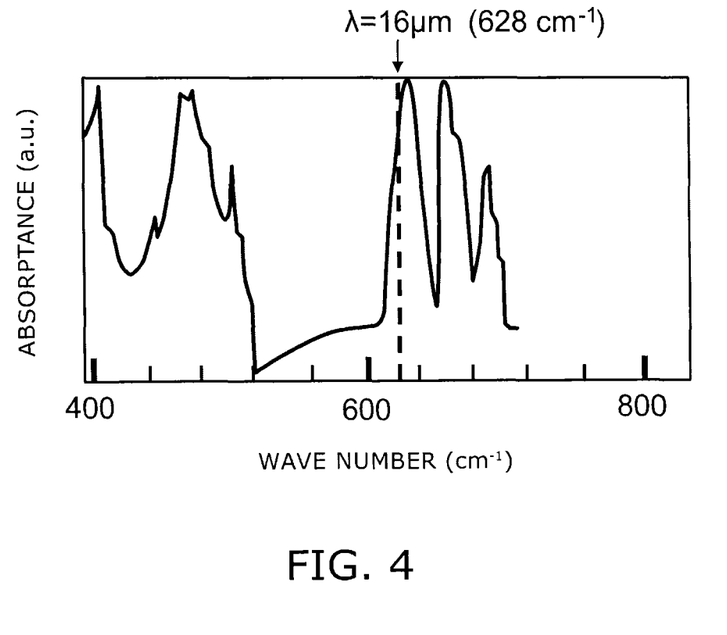
FIG. 4 is a graph showing an absorption spectrum of InP.

FIG. 4 is a graph showing an absorption spectrum of InP.

The vertical axis is the absorptance of light (relative values), and the horizontal axis is the wave number of light ($cm^{-1}$). In the case of InP, there is an absorption peak of phonons near the wavelength of 16 μm (wave number: 628 $cm^{-1}$). When the wavelength of the light emitted from the active layer 24 is 16 μm, if the layers sandwiching the side surfaces 20a and 20b of the stacked body 20 including the first and second cladding layers 22 and 28 and the active layer 24 are InP, the InP absorbs part of the light emitted form the active layer 24. In view of this, in the semiconductor laser that emits infrared laser light in a wavelength range of 12 to 18 μm, the dielectric layers 40 sandwiching the side surfaces of the active layer 24 preferably have a transmittance higher than the transmittance of InP for wavelengths of 16 μm or more.

Figure 5:
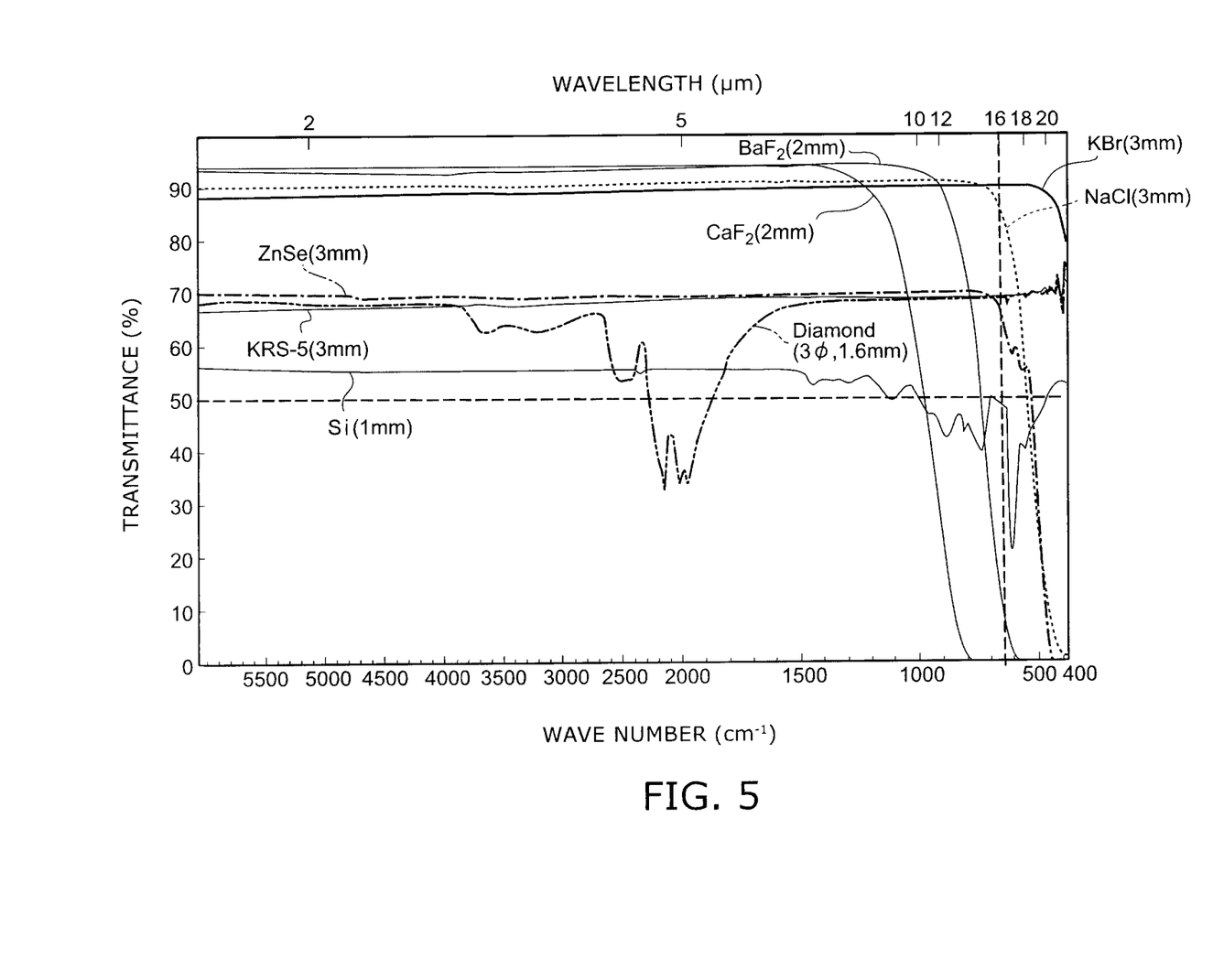
FIG. 5 is a graph showing the dependence of the transmittance of dielectric materials on the wave number.

FIG. 5 is a graph showing the dependence of the transmittance of dielectric materials on the wave number.

The vertical axis is the transmittance (%), and the horizontal axis is the wave number ($cm^{-1}$) or the wavelength (μm). The transmittance can be measured using a spectrophotometer etc.

The embodiment uses a dielectric material in which the wavelength at which the transmittance (%) of the dielectric material decreases to 50% is 16 μm or more. In FIG. 3, the maximum values of the transmittances of many materials are not 100%. In this specification, "the wavelength at which the transmittance decreases to 50%" does not mean the wavelength at which the transmittance decreases to one half of the maximum value thereof, but means "the wavelength at which the transmittance measured using a photometer etc. decreases to 50%."

When a dielectric material in which the wavelength at which the transmittance decreases to 50% is 16 μm or more is used, infrared laser light with a wavelength of 12 μm or more being absorbed can be suppressed, and it is easy to obtain high power. As such a material, KBr (refractive index: 1.5), KRS-5 (thallium bromoiodide, refractive index: 2.36), KRS-6 (thallium bromochloride, refractive index: 2.14), NaCl, KCl (refractive index: 1.49), diamond (refractive index: 2.4), ZnSe (refractive index: 2.4), and the like may be used. The inventors' experiment has revealed that it is also possible to use CdTe, AgBr, AgCl, and the like. By providing the dielectric layer 40 thus configured on both sides of part of the side surfaces 20a and 20b of the stacked body 20, it becomes easy to control the horizontal mode, while suppressing absorption of infrared laser light. When a single-crystal material formed by epitaxial growth is used as the dielectric layer 40, optical characteristics can be made more stable. In this case, KRS-5, KRS-6, diamond, ZnSe, CdTe, and the like are easily made into a single crystal.

Here, for example, the refractive index of GaAs is 3.62, and the refractive index of $Al_{0.35}Ga_{0.65}As$ is 3.47. The refractive indices of InGaAs and AlInAs are between 3.2 and 3.43. That is, the refractive index of the dielectric layer 40 is lower than the refractive indices of all the layers constituting the active layer 24, and the control of the horizontal mode of infrared laser light is easy.

FIGS. 6A to 6E are process sectional views up to forming the ridge waveguide of a method for manufacturing a semiconductor laser according to the first embodiment.

Figure 6A:
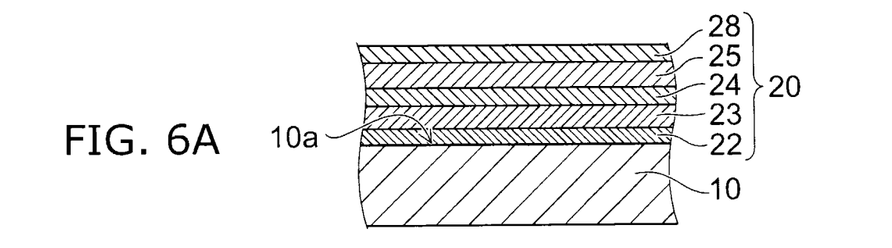
FIGS. 6A to 6E are process sectional views up to forming the ridge waveguide of a method for manufacturing a semiconductor laser according to the first embodiment.

The substrate 10 is made of n-type GaAs. As shown in FIG. 6A, on a first surface 10a of the substrate 10, for example, the first cladding layer 22 made of n-type GaAs, the first guide layer 23 made of n-type GaAs, the active layer 24, the second guide layer 25 made of n-type GaAs, and the second cladding layer 28 made of n-type GaAs are formed by crystal growth. The first guide layer 23 and the second guide layer 25 may be omitted. As the crystal growth method, for example, the MBE (molecular beam epitaxy) method or the MOCVD (metal organic chemical vapor deposition) method may be used.

Figure 6B:
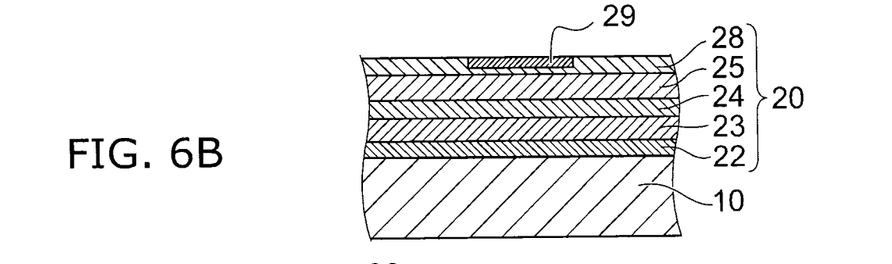
Figure 6C:
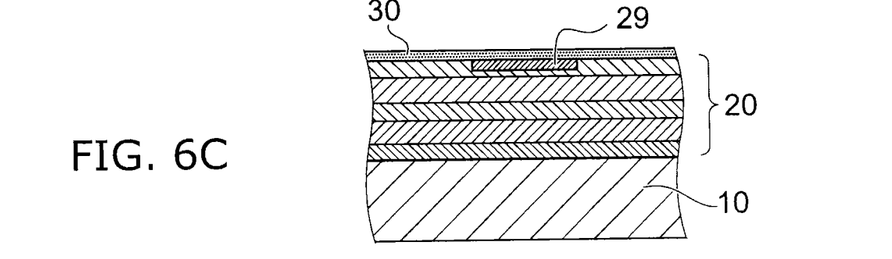

In the embodiment, the end surfaces of the ridge waveguide RG may be configured to be mirror surfaces to form a Fabry-Perot optical resonator. Alternatively, as shown in FIG. 6B, a diffraction grating 29 may be provided on the surface of the second cladding layer 28 or the like. The diffraction grating 29 is provided in the optical axis direction of the optical resonator in such a manner that the pitch of convex-concave structures is, for example, one half of the in-medium wavelength. Such a configuration can form a structure of distributed feedback (DFB) or distributed Bragg reflector (DBR), and can provide dynamic single mode oscillation. Then, as shown in FIG. 6C, an insulating film 30 of $SiO_2$ or the like is formed on the surface of the second cladding layer 28.

Figure 6D:
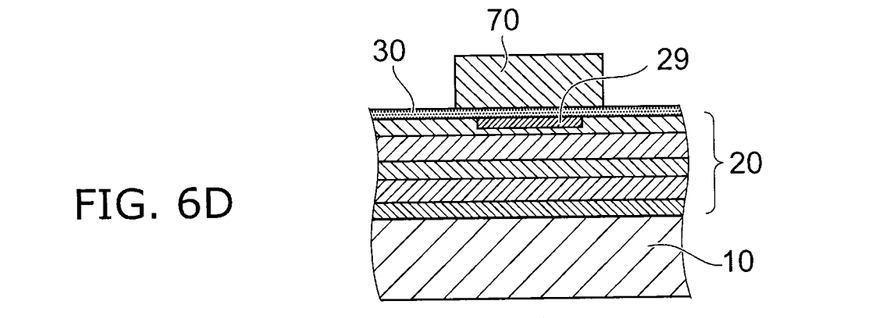
Figure 6E:
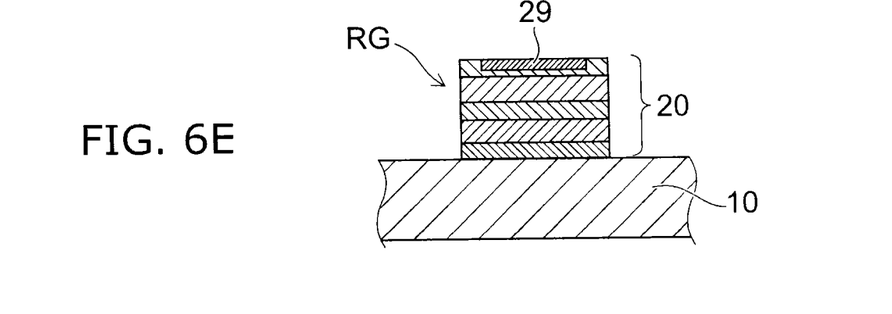

Subsequently, as shown in FIG. 6D, a photoresist 70 is patterned in a striped configuration in the region that forms the ridge waveguide RG. As shown in FIG. 6E, the patterned photoresist 70 is used as a mask to etch the stacked body 20 using the RIE (reactive ion etching) method or the like to form the ridge waveguide RG. Then, the insulating film 30 is removed.

FIGS. 7A to 7D are process sectional views up to forming an electrode of the method for manufacturing a semiconductor laser of the first embodiment.

Figure 7A:
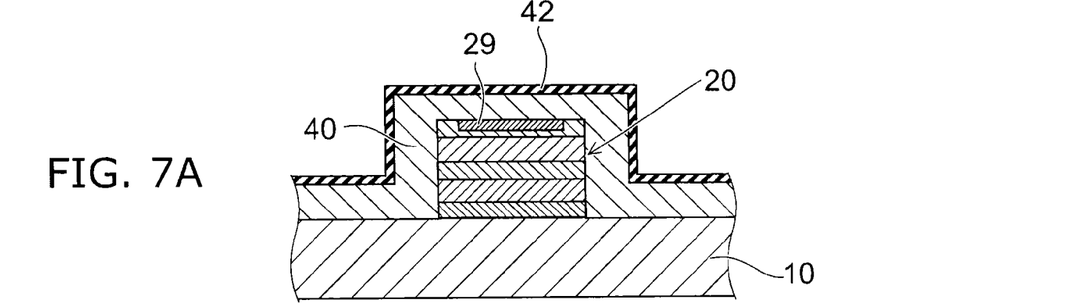
FIGS. 7A to 7D are process sectional views up to forming an electrode of the method for manufacturing a semiconductor laser of the first embodiment.

As shown in FIG. 7A, the dielectric layer 40 is formed so as to cover the ridge waveguide RG of the stacked body 20 using laser ablation, sputtering, deposition, or the like. Furthermore, the insulating film (passivation film) 42 of SiN (including $Si_3N_4$), $SiO_2$, or the like is formed thereon. The dielectric layer 40 may be made of, for example, KBr, ZnSe, NaCl, KCl, KRS-5, KRS-6, diamond, or the like so that the transmittance of light may be 50% or more at wavelengths of 16 μm or more. Although NaCl and KCl have deliquescence properties, their film quality can be kept stable by providing the passivation film 42.

Figure 7B:
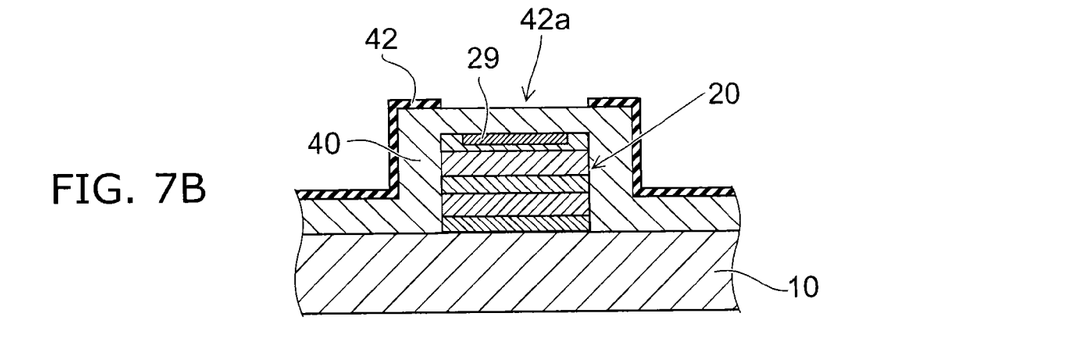

In the case where the diffraction grating is formed, as shown in FIG. 7B, an opening 42a is provided in the passivation film 42 in such a manner that the dielectric layer 40 is exposed at the upper surface of the diffraction grating 29.

Figure 7C:
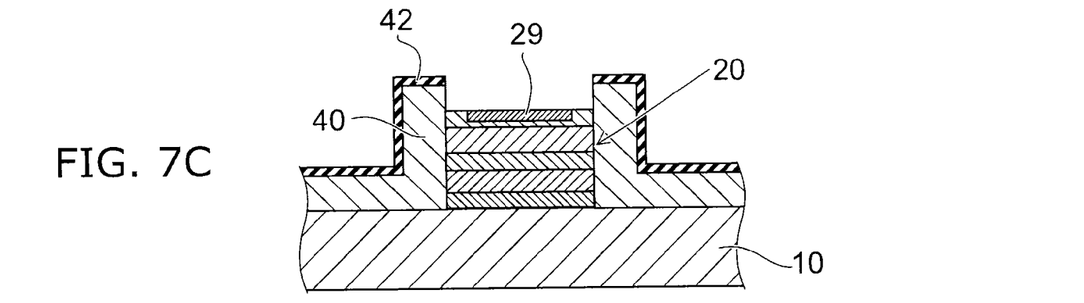

Subsequently, as shown in FIG. 7C, a portion of the dielectric layer 40 is removed to expose the diffraction grating 29 in the upper portion of the stacked body 20.

Figure 7D:
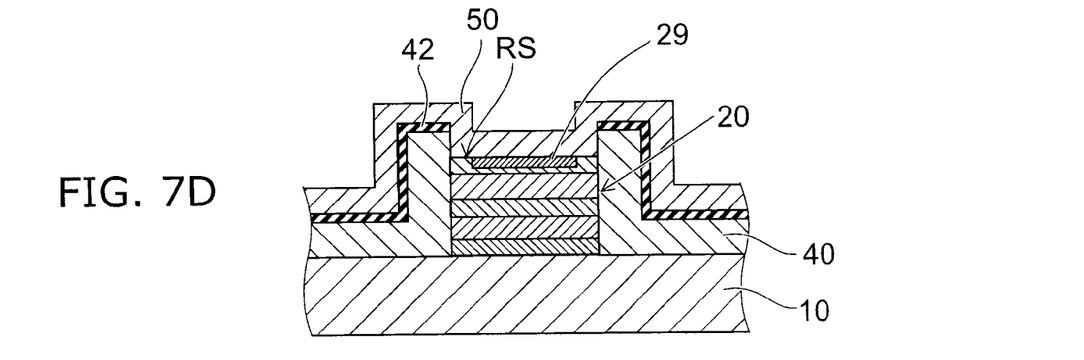

Subsequently, as shown in FIG. 7D, the first electrode 50 is formed on the passivation film 42 and the exposed surface RS of the ridge waveguide RG. Extracting high power becomes easy by employing a configuration in which a low-reflection film is provided on one end surface of the ridge waveguide RG to form a light emitting surface and a high-reflection film is provided on the other end surface to form a light reflecting surface.

Figure 8A:
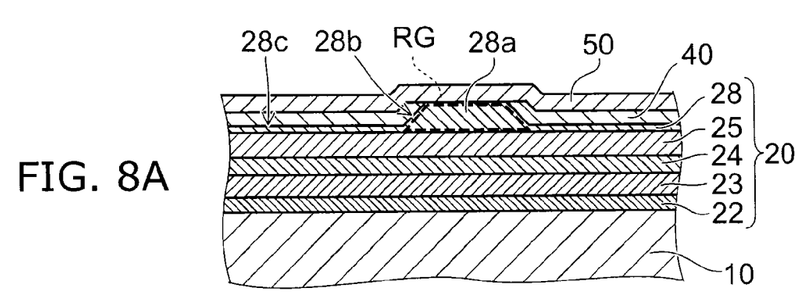
FIG. 8A is a schematic cross-sectional view of a semiconductor laser according to a first modification example of the first embodiment.
Figure 8B:
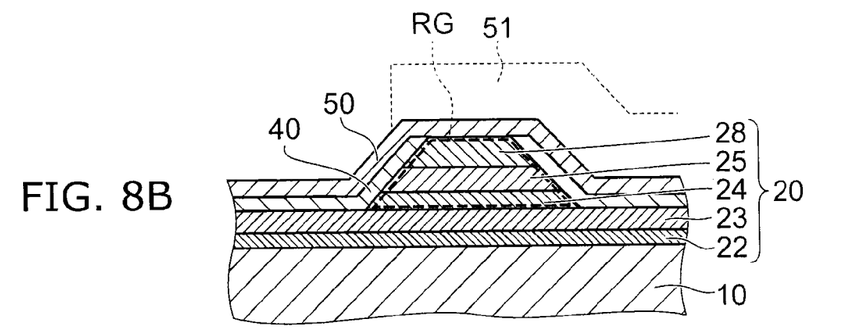
FIG. 8B is a schematic cross-sectional view of a semiconductor laser according to a second modification example of the first embodiment.

FIG. 8A is a schematic cross-sectional view of a semiconductor laser according to a first modification example of the first embodiment, and FIG. 8B is a schematic cross-sectional view of a semiconductor laser according to a second modification example of the first embodiment.

The ridge waveguide RG may not be provided in the entire stacked body 20. In FIG. 8A, a portion 28a of the second cladding layer 28 is used as the ridge waveguide RG. That is, the upper portion 28a of the second cladding layer 28 has a mesa-like cross section. The dielectric layer 40 is provided so as to cover the mesa side surfaces 28b and the surfaces 28c on the non-forming regions of mesa.

In FIG. 8B, the active layer 24, the second guide layer 25, and the second cladding layer 28 are used as the ridge waveguide RG. That is, the active layer 24, the second guide layer 25, and the second cladding layer 28 have a mesa-like cross section. The dielectric layer 40 is provided so as to cover the mesa side surfaces and the first guide layers 23 on both sides of the mesa side surfaces. Also configurations like FIGS. 8A and 8B allow the horizontal mode to be controlled. When a pad electrode 51 including a thick Au film is provided on the first electrode 50, wire bonding is easy.

Figure 9:
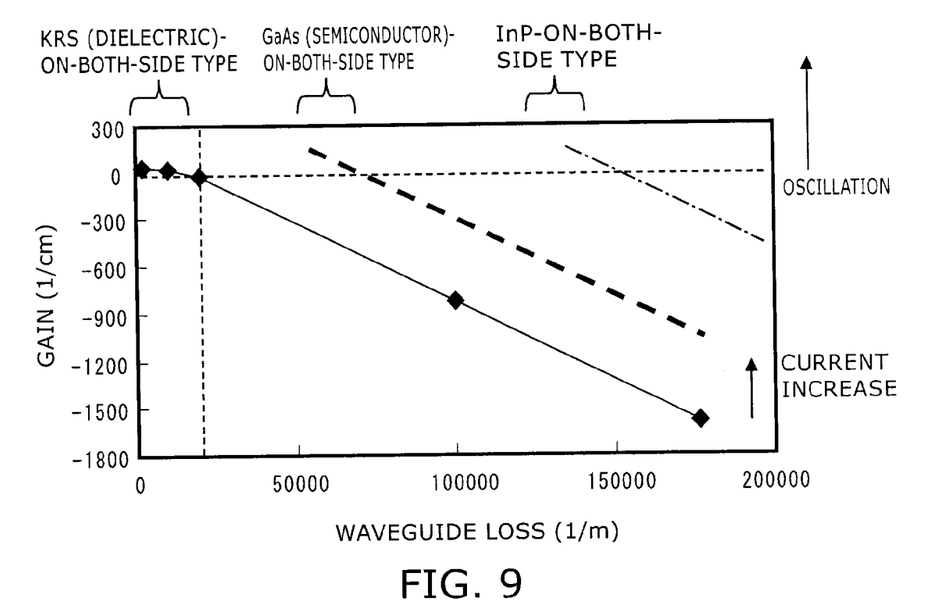
FIG. 9 is a graph showing the dependence of gain on waveguide loss.

FIG. 9 is a graph showing the dependence of gain on waveguide loss.

The vertical axis is the gain (1/cm), and the horizontal axis is the waveguide loss (1/m).

When the dielectric layer 40 that is provided on the side surface of the ridge waveguide RG and controls the horizontal mode absorbs infrared laser light, waveguide loss (1/m) is caused. On the other hand, as the current flowing through the active layer 24 increases, waveguide gain increases.

For laser oscillation, it is necessary for the gain to exceed the waveguide loss, and the operating current necessary for laser oscillation decreases in the order of InP>GaAs>dielectric materials. If the operating current is high, the inner heat generation amount is large, and continuous operation may be difficult or the semiconductor laser may deteriorate early. In the embodiment, by providing the dielectric layer 40 on both side surfaces of the active layer 24, a semiconductor laser can be provided in which continuous operation is easy and the lifetime is long.

Figure 10:
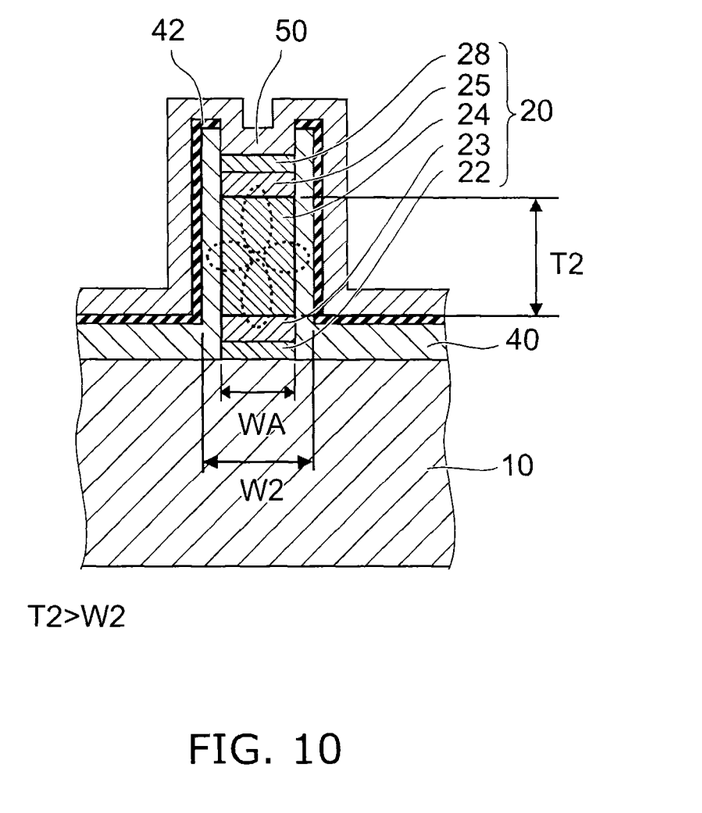
FIG. 10 is a schematic cross-sectional view of a semiconductor laser according to a second embodiment.

FIG. 10 is a schematic cross-sectional view of a semiconductor laser according to a second embodiment.

In the second embodiment, the sum W2 of the width WA of the active layer 24 and the lengths of the dielectric layers 40 provided on both side surfaces of the active layer 24 and parallel to the surface of the substrate 10 is smaller than the thickness T2 of the active layer 24. Such a configuration can reduce light traveling from the active layer 24 toward the substrate 10, and can relatively increase light traveling from the active layer 24 toward the dielectric layers 40 on both side surfaces of the active layer 24. Consequently, light absorption in the substrate 10 can be reduced. The embodiment makes it easy to suppress a decrease in light output in the case of InP or the like which causes large light absorption in the substrate 10.

The first embodiment, its accompanying first and second modification examples, and the second embodiment provide a semiconductor laser capable of emitting infrared laser light having a wavelength range of 12 to 18 μm. Such infrared laser light is absorbed into specific materials, and can therefore be used for environmental measurement etc. Furthermore, semiconductor lasers are easy to downsize as compared to carbon dioxide gas lasers, Raman lasers, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor laser comprising:
a stacked body disposed on an InP or GaAs substrate having an active layer including a quantum well layer, the active layer having a cascade structure including a first region capable of emitting infrared laser light with a wavelength of not less than 12 μm and not more than 18 μm by an intersubband optical transition of the quantum well layer and a second region capable of relaxing energy of a carrier injected from the first region alternately stacked, the stacked body having a ridge waveguide and being capable of emitting the infrared laser light in a direction along which the ridge waveguide extends, the active layer being rectangular in a cross section orthogonal to the ridge waveguide; and
a dielectric layer provided so as to sandwich at least both side surfaces of the active layer of the stacked body in the cross section, a wavelength at which a transmittance of light of the dielectric layer decreases to 50% being 16 μm or more, the dielectric layer having a refractive index lower than refractive indices of all layers constituting the active layer, the dielectric layer being made of a single-crystal ZnSe material formed directly on the InP or GaAs substrate and including neither acceptors nor donors at a region adjacent to the side surfaces of the active layer.

2. The semiconductor laser according to claim 1, further comprising:
a substrate having a first surface, the stacked body being provided on the first surface; and
a first electrode connected to the ridge waveguide.

3. The semiconductor laser according to claim 1, further comprising an insulating film covering a surface of the dielectric layer.

4. The semiconductor laser according to claim 1, wherein the second region has a plurality of minibands.

5. The semiconductor laser according to claim 1, wherein
an extraction barrier layer is provided between the first region and the second region and
an injection barrier layer is provided between the second region and the first region.

6. The semiconductor laser according to claim 1, wherein a diffraction grating is provided in the stacked body in the direction along which the ridge waveguide extends.

7. The semiconductor laser according to claim 6, wherein a pitch of the diffraction grating is one half of an in-medium wavelength.

8. The semiconductor laser according to claim 1, wherein
the ridge waveguide has a first end surface and a second end surface on an opposite side of the first end surface,
a first reflection film is provided at the first end surface, and
a second reflection film having a reflectance higher than a reflectance of the first reflection film is provided at the second end surface.

9. The semiconductor laser according to claim 1, wherein the carrier is an electron.

10. The semiconductor laser according to claim 1, wherein the active layer contains GaAs and $Al_xGa_{1-x}As$ ($0<x<1$).

11. The semiconductor laser according to claim 1, wherein the active layer contains $In_yGa_{1-y}As$ ($0<y<1$) and $Al_zIn_{1-z}As$ ($0<z<1$).

12. A semiconductor laser comprising:
a first substrate comprising an InP or GaAs substrate having a first surface;
a stacked body provided on the first surface and having an active layer including a quantum well layer, the active layer having a cascade structure including a first region capable of emitting infrared laser light with a wavelength of not less than 12 μm and not more than 18 μm by an intersubband optical transition of the quantum well layer and a second region capable of relaxing energy of a carrier injected from the first region alternately stacked, the stacked body having a ridge waveguide and being capable of emitting the infrared laser light in a direction along which the ridge waveguide extends;
a dielectric layer provided on the first surface and so as to sandwich at least both side surfaces of the active layer of the stacked body in a cross section orthogonal to the ridge waveguide, the both side surfaces being orthogonal to the first surface, a wavelength at which a transmittance of light of the dielectric layer decreases to 50% being 16 μm or more, the dielectric layer having a refractive index lower than refractive indices of all layers constituting the active layer, the dielectric layer being made of a single-crystal ZnSe material formed directly on the InP or GaAs substrate and including neither acceptors nor donors at a region adjacent to the side surfaces of the active layer; and
a first electrode connected to the ridge waveguide.

13. The semiconductor laser according to claim 12, wherein the active layer is included in the ridge waveguide.

14. The semiconductor laser according to claim 12, wherein the second region has a plurality of minibands.

15. A semiconductor laser comprising:
a first substrate comprising an InP or GaAs substrate having a first surface;
a stacked body provided on the first surface and having an active layer including a quantum well layer, the active layer having a cascade structure including a first region capable of emitting infrared laser light with a wavelength of not less than 12 μm and not more than 18 μm by an intersubband optical transition of the quantum well layer and a second region capable of relaxing energy of a carrier injected from the first region alternately stacked, the stacked body having a ridge waveguide and being capable of emitting the infrared laser light in a direction along which the ridge waveguide extends;
a dielectric layer provided on the first surface and so as to sandwich at least both side surfaces of the active layer of the stacked body in a cross section orthogonal to the ridge waveguide, the both side surfaces being orthogonal to the first surface, a wavelength at which a transmittance of light of the dielectric layer decreases to 50% being 16 μm or more, the dielectric layer having a refractive index lower than refractive indices of all layers constituting the active layer, the dielectric layer being made of a single-crystal ZnSe material formed directly on the InP or GaAs substrate and including neither acceptors nor donors at a region adjacent to the side surfaces of the active layer; and a first electrode connected to the ridge waveguide, lengths of the dielectric layer in the cross section and in a direction parallel to the first surface-plus a width of the active layer being smaller than a thickness of the active layer.

16. The semiconductor laser according to claim 15, wherein the second region has a plurality of minibands.

17. A semiconductor laser comprising:

a stacked body disposed on an InP or GaAs substrate having an active layer including a quantum well layer, the active layer having a cascade structure including a first region capable of emitting infrared laser light by an intersubband optical transition of the quantum well layer and a second region capable of relaxing energy of a carrier injected from the first region alternately stacked, the stacked body having a ridge waveguide and being capable of emitting the infrared laser light in a direction along which the ridge waveguide extends, the active layer being rectangular in a cross section orthogonal to the ridge waveguide; and a dielectric layer provided so as to sandwich at least both side surfaces of the active layer of the stacked body in the cross section, the dielectric layer having a refractive index lower than refractive indices of all layers constituting the active layer, the dielectric layer being made of at least one single-crystal material of thallium bromoiodide, thallium bromochloride, ZnSe, CdTe, and diamond formed directly on the InP or GaAs substrate and including neither acceptors nor donors at a region adjacent to the side surfaces of the active layer.

* * * * *